United States Patent
Sakamoto et al.

(10) Patent No.: US 6,706,547 B2
(45) Date of Patent: Mar. 16, 2004

(54) METHOD OF MANUFACTURING A CIRCUIT DEVICE WITH TRENCHES IN A CONDUCTIVE FOIL

(75) Inventors: Noriaki Sakamoto, Gunma (JP); Yoshiyuki Kobayashi, Gunma (JP); Junji Sakamoto, Gunma (JP); Yukio Okada, Gunma (JP); Yusuke Igarashi, Gunma (JP); Eiju Maehara, Gunma (JP); Kouji Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/010,890

(22) Filed: Dec. 6, 2001

(65) Prior Publication Data

US 2002/0133943 A1 Sep. 26, 2002

(30) Foreign Application Priority Data

Mar. 22, 2001 (JP) .................................... P 2001-083558

(51) Int. Cl.⁷ .............................. H01L 21/00; H01S 4/00
(52) U.S. Cl. .................... 438/33; 438/113; 438/124; 438/127; 438/458; 438/459; 438/462; 438/666; 29/529.1; 29/825; 29/855; 29/856
(58) Field of Search ............................ 438/22, 26, 48, 438/50, 51, 57, 106, 111, 112, 455, 460, 463, 666, 365–367, 375, 378, 384, 386; 225/1; 264/241, 259, 271.1, 272.11; 29/592, 592.1, 825, 854–856; 257/666–668, 678, 687, 734, 773, 774, 787

(56) References Cited

U.S. PATENT DOCUMENTS

| | | | | |
|---|---|---|---|---|
| 6,025,650 A | * | 2/2000 | Tsuji et al. | 257/786 |
| 6,093,584 A | * | 7/2000 | Fjelstad | 438/127 |
| 6,107,164 A | * | 8/2000 | Ohuchi | 438/465 |
| 6,238,952 B1 | * | 5/2001 | Lin | 438/110 |
| 6,306,685 B1 | * | 10/2001 | Liu et al. | 438/121 |
| 6,333,252 B1 | * | 12/2001 | Jung et al. | 438/612 |
| 6,342,730 B1 | * | 1/2002 | Jung et al. | 257/692 |
| 6,451,627 B1 | * | 9/2002 | Coffman | 438/111 |
| 6,462,418 B2 | * | 10/2002 | Sakamoto et al. | 257/753 |
| 6,501,162 B2 | * | 12/2002 | Sakamota et al. | 257/678 |
| 6,531,370 B2 | * | 3/2003 | Sakamoto et al. | 438/343 |
| 6,545,364 B2 | * | 4/2003 | Sakamoto et al. | 257/773 |
| 6,548,328 B1 | * | 4/2003 | Sakamoto et al. | 438/121 |
| 6,562,660 B1 | * | 5/2003 | Sakamoto et al. | 438/124 |
| 2002/0027276 A1 | * | 3/2002 | Sakamoto et al. | 257/690 |
| 2002/0027298 A1 | * | 3/2002 | Sakamoto et al. | 257/787 |
| 2002/0028525 A1 | * | 3/2002 | Sakamoto et al. | 438/17 |
| 2002/0030268 A1 | * | 3/2002 | Sakamoto et al. | 257/700 |

FOREIGN PATENT DOCUMENTS

| | | | | |
|---|---|---|---|---|
| JP | 2001319995 A | * | 11/2001 | H01L/23/14 |
| JP | 2002016022 A | * | 1/2002 | H01L/21/301 |
| JP | 2002026186 A | * | 1/2002 | H01L/23/12 |
| JP | 2002237545 A | * | 8/2002 | H01L/23/12 |

* cited by examiner

Primary Examiner—Alonzo Chambliss
(74) Attorney, Agent, or Firm—Fish & Richardson P.C.

(57) ABSTRACT

After conductive patterns are formed on the conductive foil every block by employing isolation trenches, conductive plating layers are arranged selectively on the conductive patterns. Therefore, it is possible to accomplish the circuit device manufacturing method by which the die bonding of the circuit elements can be applied stably and the wire bonding can also be applied stably and which can fit to the mass-production while saving the resource.

21 Claims, 12 Drawing Sheets

METHOD OF MANUFACTURING A CIRCUIT DEVICE WITH TRENCHES IN A CONDUCTIVE FOIL

BACKGROUND OF THE INVENTION

The present invention relates to a method for manufacturing circuit devices, and particularly relates to a method for manufacturing low-profile circuit devices that does not require any supporting substrate.

Circuit devices set in electronic equipment are heretofore desired to be made smaller in size, thinner in thickness and lighter in weight because they are used in portable telephones, portable computers, etc.

For example, a semiconductor device will be described as such a circuit device by way of example. As a typical semiconductor device, there is conventionally a packaged semiconductor device sealed by usual transfer-molding. This semiconductor device is mounted on a printed circuit board PS as shown in FIG. 11.

In the packaged semiconductor device 1, a semiconductor chip 2 is covered with a resin layer 3, and lead terminals 4 for external connection are led out from side portions of the resin layer 3.

Because the lead terminals 4 are led from the resin layer 3 to the outside, the whole size of the packaged semiconductor device 1 is, however, too large to satisfy the request to make it smaller in size, thinner in thickness and lighter in weight.

Therefore, various structures have been developed by various manufacturers in order to make packaged semiconductor devices smaller in size, thinner in thickness and lighter in weight. Recently, the packaged semiconductor devices are developed into Chip Size Packages (CSPs) such as wafer-scale CSPs as large as the chip size, or CSPs a little larger than the chip size.

FIG. 12 shows a CSP 6 which uses a glass epoxy substrate 5 as a supporting substrate and which is a little larger than the chip size. Here, description will be made on the assumption that a transistor chip T has been mounted on the glass epoxy substrate 5.

A first electrode 7, a second electrode 8 and a die pad 9 are formed on the front surface of the glass epoxy substrate 5 while a first back-surface electrode 10 and a second back-surface electrode 11 are formed on the back surface of the glass epoxy substrate 5. The first and second electrodes 7 and 8 are electrically connected to the first and second back-surface electrodes 10 and 11 via through holes TH respectively. In addition, the bare transistor chip T is firmly fixed to the die pad 9. An emitter electrode of the transistor is connected to the first electrode 7 through a metal fine wire 12, and a base electrode of the transistor is connected to the second electrode 8 through a metal fine wire 12. Further, a resin layer 13 is provided on the glass epoxy substrate 5 so as to cover the transistor chip T.

The CSP 6 uses the glass epoxy substrate 5 to thereby achieve a simple structure extending from the chip T to the back-surface electrodes 10 and 11 for external connection, compared with a wafer-scale CSP. Thus, there is a merit that the CSP 6 can be manufactured inexpensively.

In addition, the CSP 6 is mounted on a printed circuit board PS as shown in FIG. 11. Electrodes and wiring for constituting an electric circuit are provided on the printed circuit board PS, and the CSP 6, the packaged semiconductor device 1, a chip resistor CR or a chip capacitor CC, etc. are electrically connected and firmly fixed to the printed circuit broad PS.

Then, the circuit constituted on the printed circuit board will be attached to various sets.

Next, a method for manufacturing the CSP will be described with reference to FIGS. 13A to 13D and FIG. 14.

First, the glass epoxy substrate 5 is prepared as a base material (as a supporting substrate), and Cu foils 20 and 21 are bonded to both sides of the glass epoxy substrate 5 through an insulating bonding material respectively (the above step is illustrated in FIG. 13A).

Subsequently, the Cu foils 20 and 21 corresponding to the first electrode 7, the second electrode 8, the die pad 9, the first back-surface electrode 10 and the second back-surface electrode 11 are covered with an etching-proof resist 22 and patterned. Incidentally, the front surface and the back surface of the glass epoxy substrate 5 may be patterned separately (the above step is illustrated in FIG. 13B).

Subsequently, holes for the through holes TH are formed in the glass epoxy substrate by use of a drill or a laser, and then plated. Thus, the through holes TH are formed. Via the through holes TH, the first and second electrodes 7 and 8 are electrically connected to the first and second back-surface electrodes 10 and 11 respectively (the above step is illustrated in FIG. 13C).

Further, though not shown, the first and second electrodes 7 and 8 which will be bonding posts are plated with Ni, while the die pad 9 which will be a die bonding post is plated with Au. Then, the transistor chip T is die-bonded.

Finally, the emitter electrode and the base electrode of the transistor chip T are connected to the first and second electrodes 7 and 8 through the metal fine wires 12 respectively, and covered with the resin layer 13 (the above step is illustrated in FIG. 13D).

In the above-mentioned manufacturing method, a CSP type electric element using the supporting substrate 5 is produced. Alternatively, in this manufacturing method, the glass epoxy substrate 5 may be replaced by a flexible plate as a supporting substrate to produce the CSP type electric element similarly.

On the other hand, a manufacturing method useing a ceramic substrate is shown in the flow chart of FIG. 14. A ceramic substrate which is a supporting substrate is prepared, and through holes are formed therein. After that, front-surface and back-surface electrodes are printed with conductive paste, and sintered. The following steps up to covering with a resin layer are the same as those in the manufacturing method in FIGS. 13A–13D. However, differently from the flexible sheet or the glass epoxy substrate, the ceramic substrate is very fragile to be chipped easily. Therefore, there is a problem that the ceramic substrate cannot be molded by use of a mold. Thus, the CSP type electric element is produced by potting sealing resin on the ceramic substrate, hardening the sealing resin, polishing the sealing resin to be even, and finally separating the ceramic substrate with the sealing resin individually by use of a dicing apparatus. Also in the case where the glass epoxy substrate is used, there is a fear that the substrate is crushed when it is strongly held by a mold for transfer-molding.

In FIG. 12, the transistor chip T, the connection member 7 to 12, and the resin layer 13 are essential constituent elements for electric connection with the outside and protection of the transistor. However, it is difficult to provide a circuit element made smaller in size, thinner in thickness and lighter in weight, by using all of such essential elements.

In addition, the glass epoxy substrate 5 which is a supporting substrate is unnecessary by nature as described above. However, in the manufacturing method, the glass epoxy substrate 5 cannot be omitted because the glass epoxy substrate 5 is used as a supporting substrate for bonding electrodes to each other.

Because the glass epoxy substrate 5 is used, the cost increases. Further, because the glass epoxy substrate 5 is thick, the circuit element becomes thick. Accordingly, there is a limit in making the circuit element smaller in size, thinner in thickness and lighter in weight.

Further, in the glass epoxy substrate and the ceramic substrate, the step of forming the through hole for connecting the electrodes of the both sides of the substrate is indispensable, thus causing the manufacturing process prolonged.

SUMMARY OF THE INVENTION

The present invention has been made in view of above mentioned many subjects, and provides a circuit device manufacturing method that comprises the steps of forming conductive patterns by preparing a conductive foil and then forming isolation trenches, that are shallower than a thickness of the conductive foil, on the conductive foil in regions except the conductive patterns on which at least a number of mounting portions of circuit elements are formed; covering surfaces of the conductive patterns and the isolation trenches with a resist layer and forming a conductive plating layer in desired regions of the conductive patterns; adhering circuit elements on the conductive plating layer on respective mounting portions of desired conductive patterns; covering collectively the circuit elements on respective mounting portions and molding commonly a insulating resin to fill the isolation trenches; removing the conductive foil having thickness portions in which the isolation trenches are not provided; and separating the insulating resin into respective mounting portions by dicing.

In the present invention, the conductive foil to form the conductive patterns is the starting material, and the supporting substrate can be eliminated since the conductive foil has the supporting function until the insulating resin is molded and also the insulating resin has the supporting function after the molding, whereby the subjects in the background art can be overcome.

Also, in the present invention, the conductive plating layers are formed selectively in desired regions of the conductive patterns after the isolation trenches are formed, and the circuit elements are die-bonded to the conductive plating layers. Therefore, good contact between the circuit elements and the conductive patterns can be achieved and in addition a large number of circuit devices can be mass-produced by executing the processes every block, whereby the subjects in the background art can be overcome.

DETAILED DESCRIPTION OF THE PREFERRED EMBODIMENT

First, a circuit device manufacturing method of the present invention will be explained with reference to FIG. 1.

The present invention provides a circuit device manufacturing method that comprises the steps of forming conductive patterns by preparing a conductive foil and then forming isolation trenches, that are shallower than a thickness of the conductive foil, on the conductive foil in regions except the conductive patterns on which at least a number of mounting portions of circuit elements are formed; covering surfaces of the conductive patterns and the isolation trenches with a resist layer and forming a conductive plating layer in desired regions of the conductive patterns; adhering circuit elements on the conductive plating layer on respective mounting portions of desired conductive patterns; forming connecting means that connect electrically electrodes of the circuit elements on respective mounting portions and desired conductive patterns; covering collectively the circuit elements on respective mounting portions and molding commonly a insulating resin to fill the isolation trenches; removing the conductive foil having thickness portions in which the isolation trenches are not provided; and separating the insulating resin into respective mounting portions by dicing.

Figure 1:
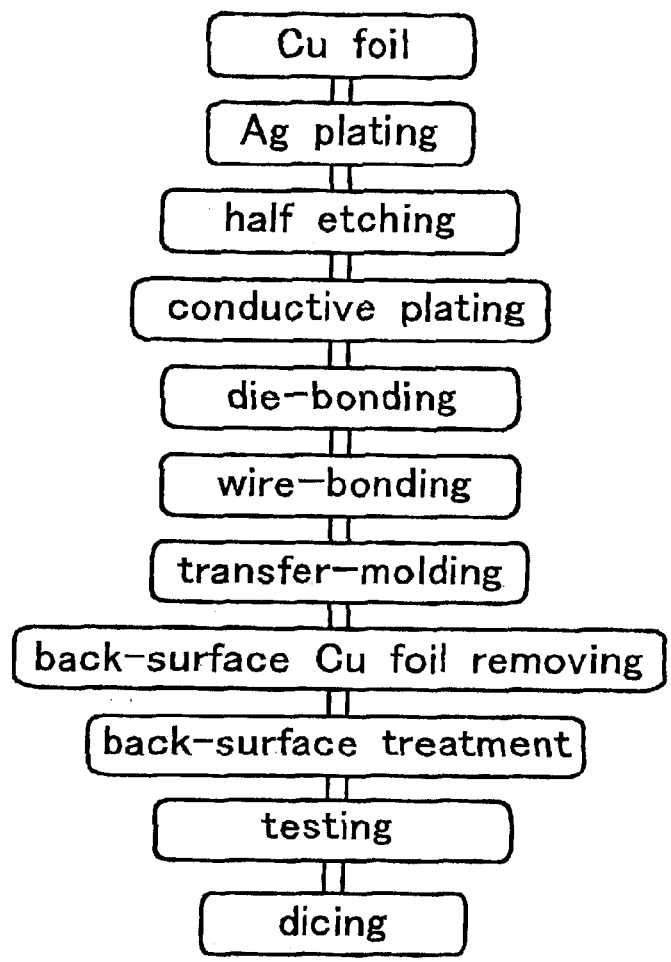
FIG. 1 is a view showing a manufacturing flow of the present invention.

A flow shown in FIG. 1 does not corresponds to the above steps. In three flow steps of Cu foil, Ag plating, and half etching, the formation of the conductive pattern is carried out. In the flow steps of conductive plating, the conductive plating layer is formed on a part of the conductive pattern. In two flow steps of die bonding and wire bonding, the adhesion of circuit elements on respective mounting portions and the connection between electrodes of the circuit elements and the conductive patterns are carried out via the conductive plating layer. In the flow of transfer molding, common molding by the insulating resin is carried out. In the flow step of removal of the Cu foil on the back-surface, etching of the conductive foil in the portion that has a thickness without the isolation trench is carried out. In the flow step of back-surface treatment, electrode treatment of the conductive pattern exposed from the back surface is carried out. In the flow step of measurement, the quality decision and the characteristic ranking classification of circuit elements that are incorporated onto respective mounting portions are carried out. In the flow step of dicing, separation of the insulating resin into individual circuit elements by the dicing is carried out.

Respective steps of the present invention will be explained with reference to FIGS. 2 to 10 hereinafter.

Figure 2A:
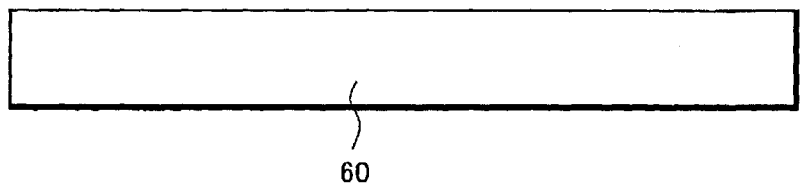
FIGS. 2A and 2B are views showing a circuit device manufacturing method of the present invention.
Figure 2B:
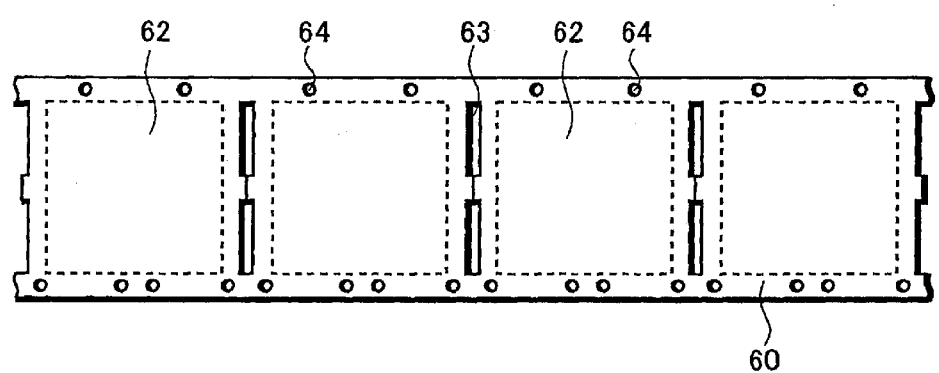
Figure 3:
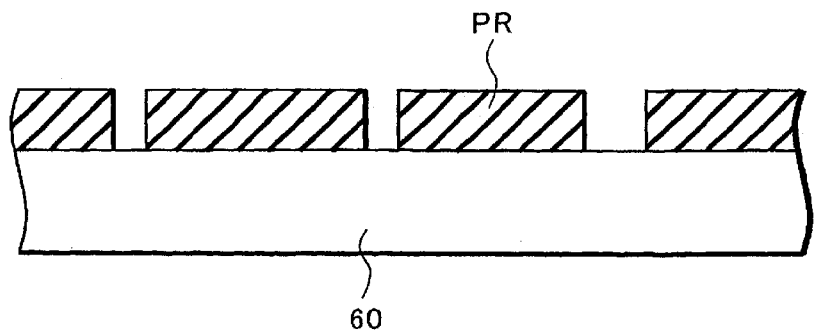
FIG. 3 is a view showing a circuit device manufacturing method of the present invention.
Figure 6:
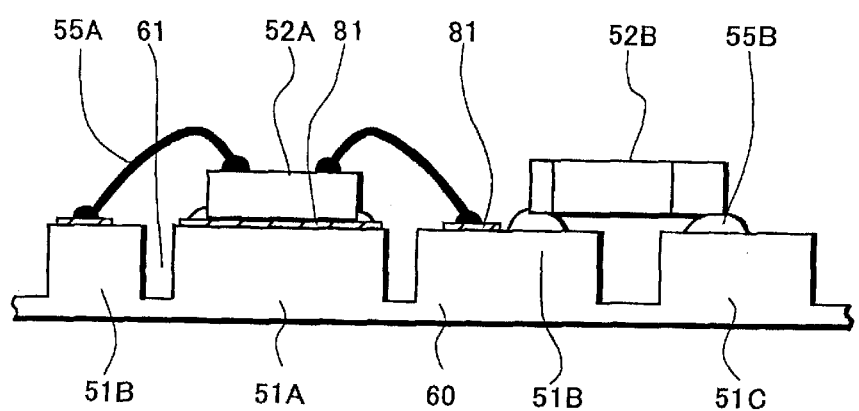
FIG. 6 is a view showing a circuit device manufacturing method of the present invention.

As shown in FIG. 2 to FIG. 4, the first step of the present invention involves preparing a conductive foil 60 and isolation trenches 61 are formed in the conductive foil 60 to produce conductive patterns 51., The isolation trenches 61 are shallower than a thickness of the conductive foil 60. The conductive patterns 51 have at least a number of mounting portions for mounting circuit elements, such as circuit elements 52A and 52B as seen in FIG. 6.

In the present step, as shown in FIG. 2A, first the sheet-like conductive foil 60 is prepared. The material of this conductive foil 60 is selected in view of adhesiveness of the brazing material, bonding characteristic, and plating characteristic. The conductive foil using Cu as the main material, the conductive foil using Al as the main material, the conductive foil formed of an alloy such as Fe—Ni or the like is employed as such material.

It is preferable in light of the later etching that a thickness of the conductive foil should be of about 10 μm to 300 μm, and the copper foil of 70 μm (2 ounce) is employed here. However, basically more than 300 μm or less than 10 μm may be employed. As described later, any thickness may be employed if the isolation trenches 61 that are shallower than the thickness of the conductive foil 60 may be formed.

In this case, the sheet-like conductive foil 60 that is wrapped like a roller to have a predetermined width, e.g., 45 mm may be prepared and then may be carried to respective steps described later. Otherwise, the strip-like conductive foils 60 that are cut to have a predetermined size may be prepared and then may be carried to respective steps described later.

More particularly, as shown in FIG. 2B, four or five blocks 62 in which a large number of mounting portions are formed are aligned separately on the strip-like conductive foil 60. Slits 63 are provided between the blocks 62 to absorb the stress in the conductive foil 60 generated by the heating process such as the molding step, etc. Also, index holes 64 are provided to upper and lower peripheral ends of the conductive foil 60 at a predetermined interval and used to align in respective steps.

In turn, conductive patterns are formed.

Figure 4A:
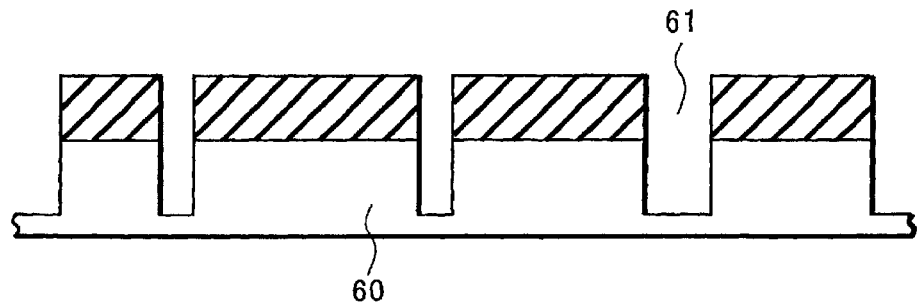
FIGS. 4A and 4B are views showing a circuit device manufacturing method of the present invention.

First, as shown in FIG. 3, photoresist (etching-resistant mask) PR is formed on the Cu foil 60, and then the photoresist PR is patterned to expose the conductive foil 60 except the regions to become the conductive patterns 51. Then, as shown in FIG. 4A, the conductive foil 60 is selectively etched via the photoresist PR.

A depth of the isolation trenches 61 formed by the etching 50 μm, for example, and thus the adhesiveness to an insulating resin 50 can be improved since side surfaces of the isolation trench become a rough surface.

Also, the side walls of the isolation trenches 61 are show schematically straightly, but they have a different structure according to the removing method. As the removing step, wet etching, dry etching, evaporation by the laser, or dicing may be employed. In the case of the wet etching, iron (II) chloride or copper (II) chloride may be employed mainly as the etchant. The conductive foil is dipped into this etchant or is subjected to the showing by this etchant. Here, since normally the conductive foil is etched non-anisotropically by the wet etching, their side surfaces have a curved structure.

Also, in the case of the dry etching, the anisotropic and non-anisotropic etching can be carried out. It is said at present that Cu cannot be removed by the reactive ion etching but can be removed by the sputtering. Also, the anisotropic and non-anisotropic etching can be carried out according to the sputtering conditions.

Also, in the case of the laser, the isolation trench 61 can be formed by irradiating the laser beam directly. In this event, the side surfaces of the isolation trench 61 are formed rather straightly.

Figure 4B:
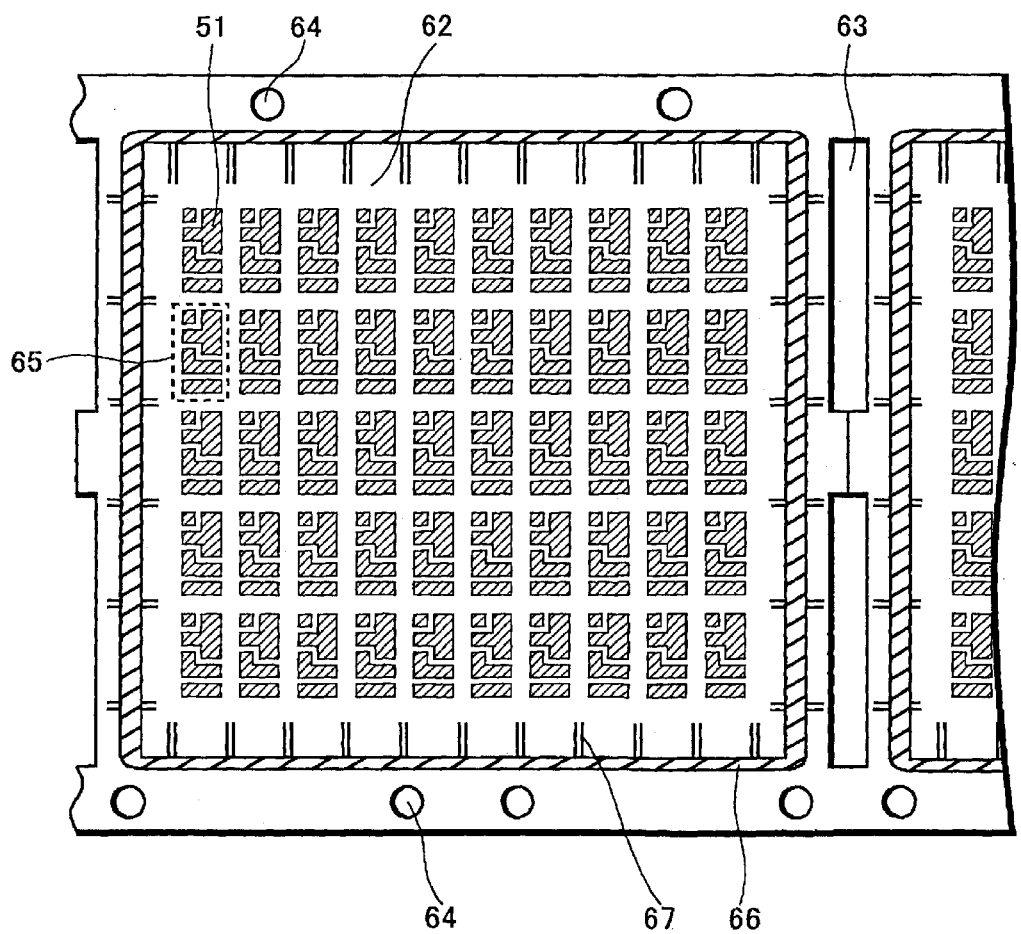

The specific conductive pattern 51 is shown in FIG. 4B. One black-shaded portion is one mounting portion 65 to constitute the conductive pattern 51. A large number of mounting portions 65 are aligned in the 5 row/10 column matrix fashion in one block 62. The same conductive pattern 51 is provided every mounting portion 65. A frame-like pattern 66 is provided around each block, and alignment marks 67 are provided on the inner side of the frame-like pattern 66 slightly apart from this pattern. The frame-like pattern 66 is used to fit to the molding, and has a function to reinforce the insulating resin 50 after the back surface of the conductive foil 60 is etched.

Figure 5A:
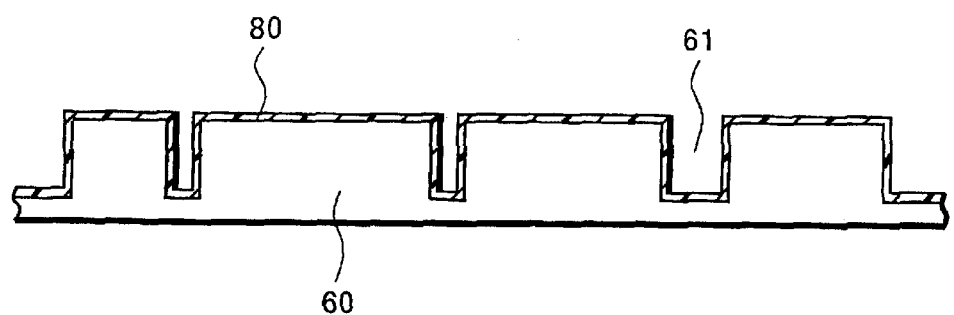
FIGS. 5A and 5B are views showing a circuit device manufacturing method of the present invention.
Figure 5B:
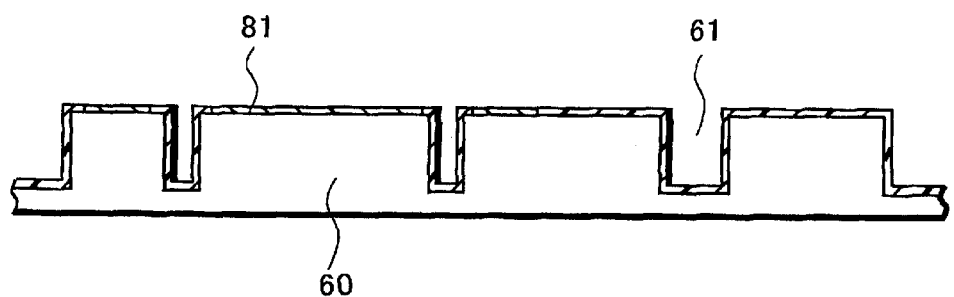

As shown in FIGS. 5A and 5B, in the second step of the present invention, surfaces of the conductive patterns 51 and the isolation trenches 61 are covered with a resist layer 80 and that a conductive plating layer 81 is formed in desired regions of the conductive patterns 51.

In the present step, the photoresist PR used in forming the isolation trenches 61 is removed and also the surfaces of the conductive patterns 51 and the isolation trenches 61 are cleaned. Then, the resist layer 80 is deposited onto the overall surface by the electrode position.

Then, the resist layer 80 formed on the die-pad regions and the bonding-pad regions, to which circuit elements 52 of the conductive patterns 51 are fixed, is removed by exposure/development to expose selectively the conductive patterns 51. Then, a conductive plating layer 81 is formed thereon by the electrolytic plating. For this reason, the event that the conductive plating layer 81 is always formed smaller than the conductive pattern 51 fulfills an important function in pattern recognition executed in the later step.

The material applied as the conductive plating layer 81, there is Ag, Ni, Au, Pt, Pd, or the like. These materials have such a feature that they can be practically used as the die pad or the bonding pad as they are. The optimum materials in manufacturing are Ag and Au, and Ag is inexpensive in cost.

For example, the Ag plating layer can be adhered to Au and also adhered to the brazing material. Thus, if the Au film is coated on the back surface of the chip, this chip can be thermo-compression-bonded to the Ag plating layer on the conductive pattern 51 as it is, or the chip can be fixed via the brazing material such as solder, etc. Also, since an Au fine wire can be connected to the Ag plating layer, the wire bonding can be applied to the Ag plating layer. Therefore, this Ag plating layer has such a merit that the conductive plating layer can be practically used as the die pad or the bonding pad as it is.

As shown in FIG. 6, in the third step of the present invention, the circuit elements 52 are fixed on the conductive plating layers 81 of the desired conductive patterns 51 on respective mounting portions 65 and that connecting member for connecting electrically electrodes of the circuit elements 52 on respective mounting portions 65 and the conductive plating layers 81 of the desired conductive patterns 51 are formed.

As the circuit elements 52, bare semiconductor chips and/or chip circuit components are used. Specifically, the semiconductor devices such as the transistor, the diode or the IC chip, etc. and the passive elements such as the chip capacitor or the chip resistor, etc can be used for the circuit elements 52. Also, although a thickness is increased, the face-down semiconductor elements such as CSP (Chip Size Package), BGA (Ball Grid Array), etc. may be packaged.

Here, bare transistor chips 52A are die-bonded onto the conductive plating layers 81 of the conductive patterns 51A, and also emitter electrodes and the conductive plating layers 81 of the conductive patterns 51B and base electrodes and the conductive plating layers 81 of the conductive patterns 51B are connected respectively via metal fine wires 55A that are bonded by the ball bonding using the thermo compression bonding, the wedge bonding using the ultrasonic wave, or the like. Also, 52B denotes the chip capacitor or the passive element that is fixed by the brazing material such as the solder or a conductive paste 55B.

In the present step, there is the merit that, since a number of conductive patterns 51 are integrated in each block, the fixation and the wire bonding of the circuit elements 52 can be extremely effectively carried out. Also, in recognizing the patterns of the die pads and the bonding pads, the recognition of the conductive plating layers 81 can be facilitated based on contrasts between the conductive patterns 51 and the conductive plating layers 81. Thus, there is also the merit that recognition fault due to the diffused reflection of the light by the isolation trenches 61 can be prevented.

Figure 7A:
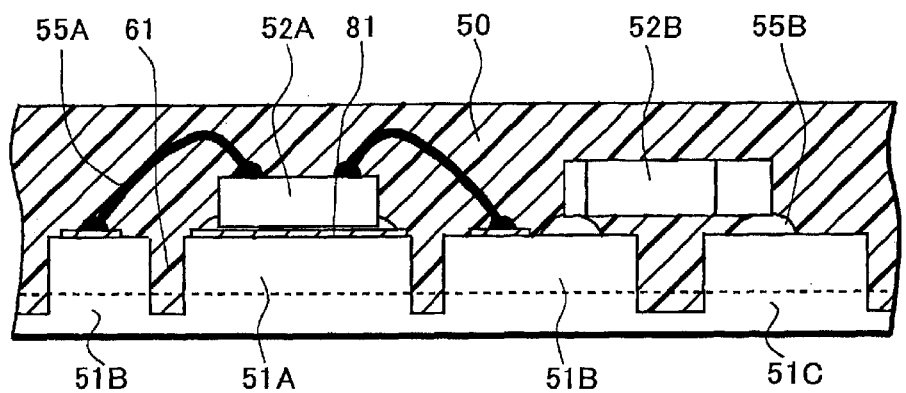
FIGS. 7A and 7B are views showing a circuit device manufacturing method of the present invention.

As shown in FIG. 7A, in the fourth step of the present invention, the insulating resin 50 is commonly molded to cover collectively the circuit elements 52 and to fill the isolation trenches 61.

In the present step, as shown in FIG. 7A, the insulating resin 50 covers completely the circuit elements 52A, 52B and a plurality of conductive patterns 51A, 51B, 51C, and also the insulating resin 50 is filled in the isolation trenches 61 between the conductive patterns 51 and coupled to side surfaces of the conductive patterns 51A, 51B, 51C, whereby the firm anchor effect can be achieved. Then, the conductive patterns 51 are supported by the insulating resin 50.

Also, in the present step, the insulating resin 50 can be implemented by the transfer mold, the injection mold, or the dipping. As the resin material, thermosetting resin such as epoxy resin, etc. can be implemented by the transfer mold, and thermoplastic resin such as polyimide resin, polyphenylene sulfide, etc. can be implemented by the injection mold.

Figure 7B:
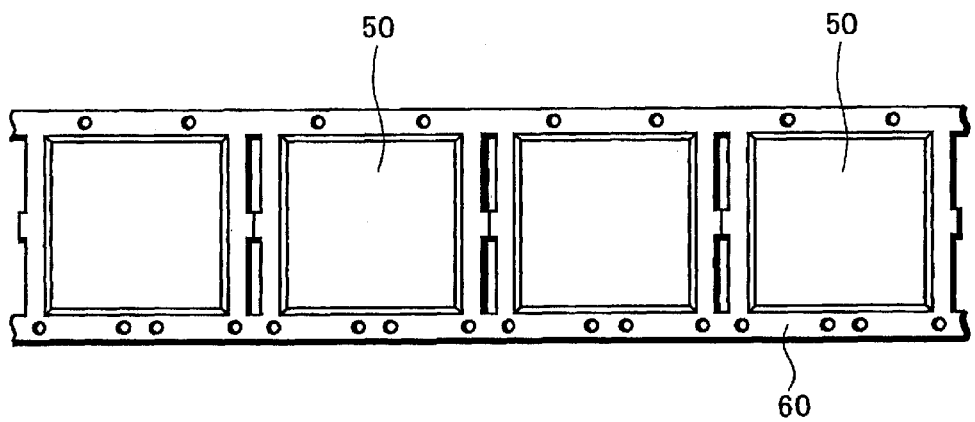

In addition, in executing the transfer mold or the injection mold in the present step, as shown in FIG. 7B, each block contains mounting portions (reference 65 in FIG. 9) in one common mold, and the molding is executed commonly by the insulating resin 50 for every block. Therefore, an amount of resin can be reduced considerably compared to the conventional transfer mold which requires molding individual mounting portions.

A thickness of the insulating resin 50 covered on the conductive foil 60 is adjusted such that about 100 μm depth from the uppermost portion of the bonding wire 55A of the circuit elements 52 is covered with the insulating resin 50. This thickness maybe increased or decreased in view of the strength.

In this step, the conductive foil 60 serving as the conductive patterns 51 acts as the supporting substrate until the insulating resin 50 is covered. In the background art, as shown in FIG. 13, conductive paths 7 to 11 are formed by employing the supporting substrate 5 that is not essentially required, whereas the conductive foil 60 acting as the supporting substrate is required for the electrode material in the present invention. Therefore, the merit that the constituent material is omitted to the utmost to operate can be achieved, and the reduction in cost can also be achieved.

Also, since the isolation trenches 61 are formed shallower than the thickness of the conductive foil 60, such conductive foil 60 is not separated individually into the conductive patterns 51. Accordingly, the present step has the feature that, since the sheet-like conductive foil 60 can be handled in one unit, operations of carrying to the mold and installing to the mold in molding the insulating resin 50 can be made very easy.

As shown in FIG. 7, in the fifth step of the present invention, the conductive foil 60 is removed from the back surface of the conductive foil 60 so that the insulating resin 50 provided in the isolation trenches 61 can be exposed.

The present step is to separate the conductive foil 60 into the conductive patterns 51 by removing the back surface of the conductive foil 60 chemically and/or physically. This step is applied by polishing, grinding, etching, metal evaporation by the laser, etc.

In the experiment, the overall surface is ground by the polishing machine or the grinding machine by about 30 μm to expose the insulating resin 50 from the isolation trenches 61. The exposed surfaces are indicated by a dotted line in FIG. 7. As a result, the conductive foil 60 is separated as the conductive patterns 51 having a thickness of about 40 μm. Also, the insulating resin 50 maybe exposed by applying the wet etching to the overall surface of the conductive foil 60 until insulating resin 50 is exposed.

Figure 12:
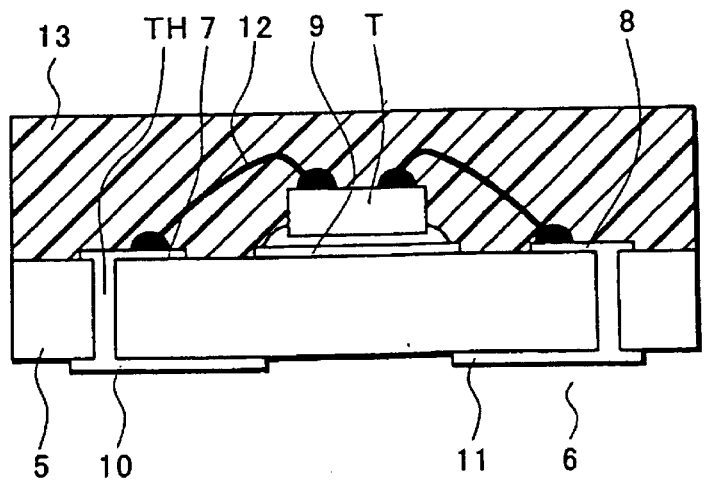
FIG. 12 is a view showing the circuit device in the background art.
Figure 13A:
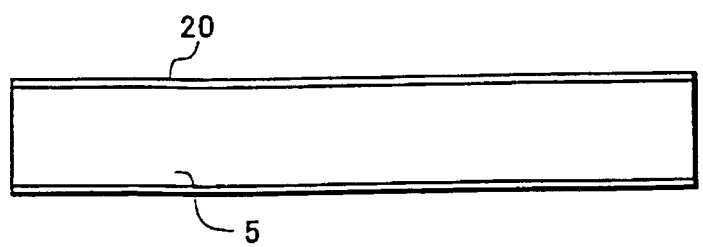
FIGS. 13A to 13D are views showing a circuit device manufacturing method in the background art.
Figure 13B:
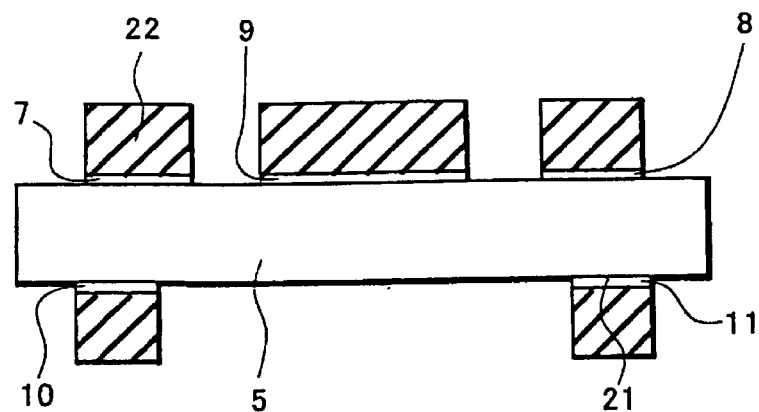
Figure 13C:
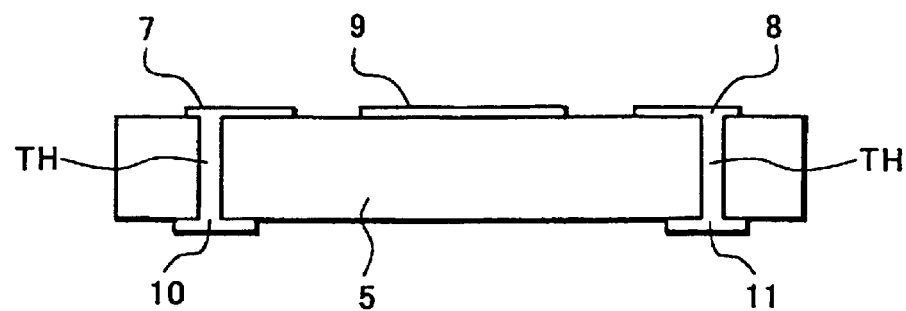
Figure 13D:
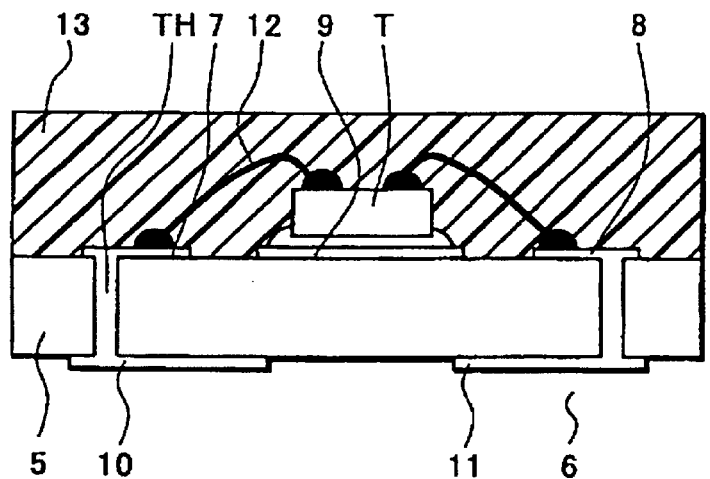
Figure 14:
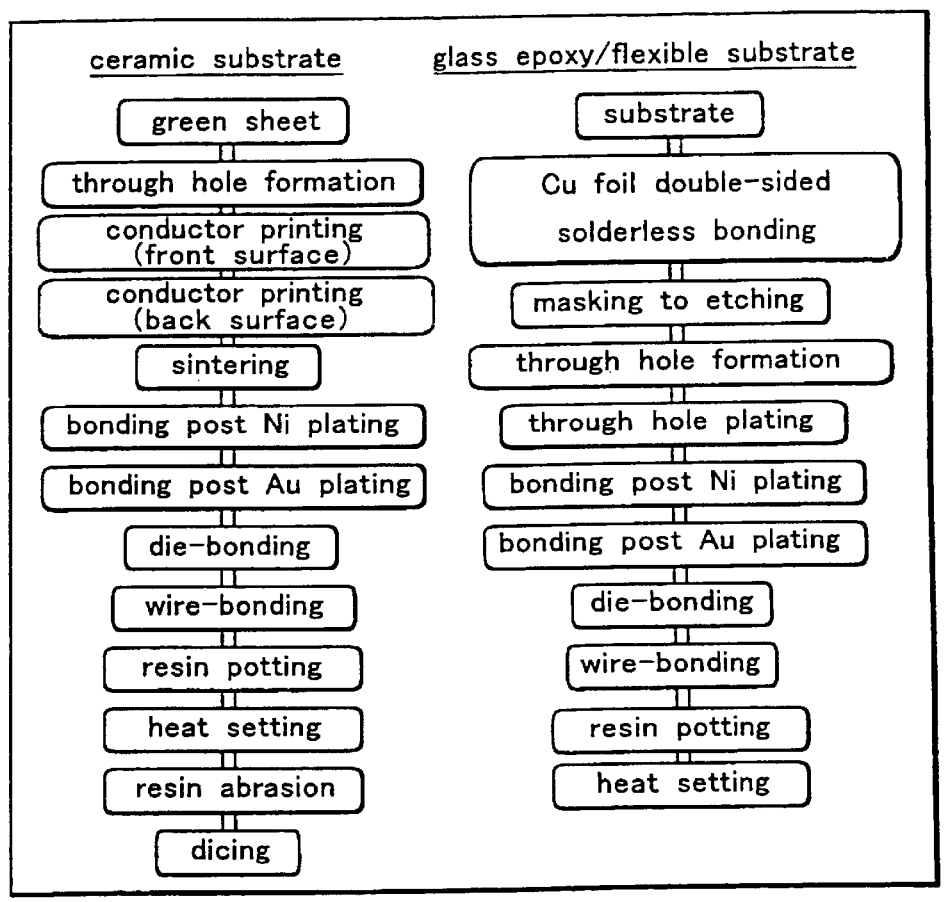
FIG. 14 is a view showing a circuit device manufacturing method in the background art.

As a result, the structure in which the back surfaces of the conductive patterns 51 are exposed from the insulating resin 50 is obtained. In other words, the structure in which the surface of the insulating resin 50 filled in the isolation trenches 61 substantially coincides with the surfaces of the conductive patterns 51 is obtained. Therefore, since the level difference like the back-surface electrodes 10, 11 shown in FIG. 12 in the background art is not provided, the circuit device 53 of the present invention has such a feature that the circuit element can be moved horizontally, as it is, by the surface tension of the solder, or the like and thus self-aligned in mounting.

Figure 8:
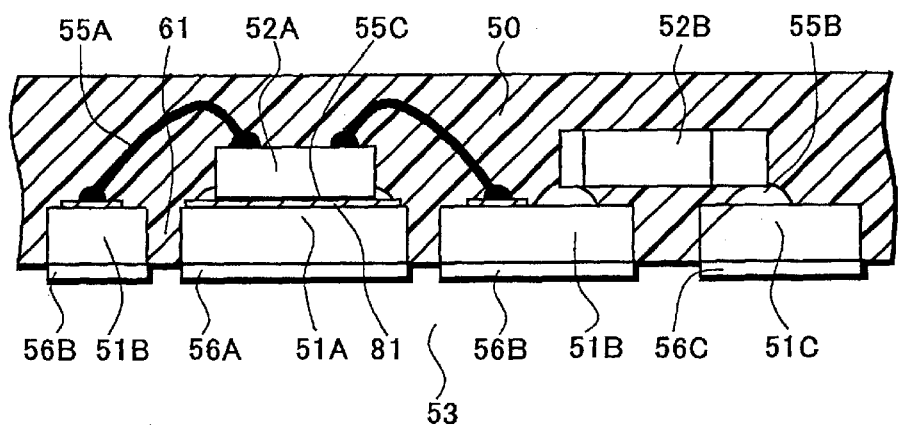
FIG. 8 is a view showing a circuit device manufacturing method of the present invention.

In addition, the back-surface treatment of the conductive patterns 51 is applied, so that the final structure shown in FIG. 8 can be obtained. That is, the conductive material such as the solder, etc. is deposited onto the exposed conductive patterns 51 as the case may be, whereby the circuit device is completed.

Figure 9:
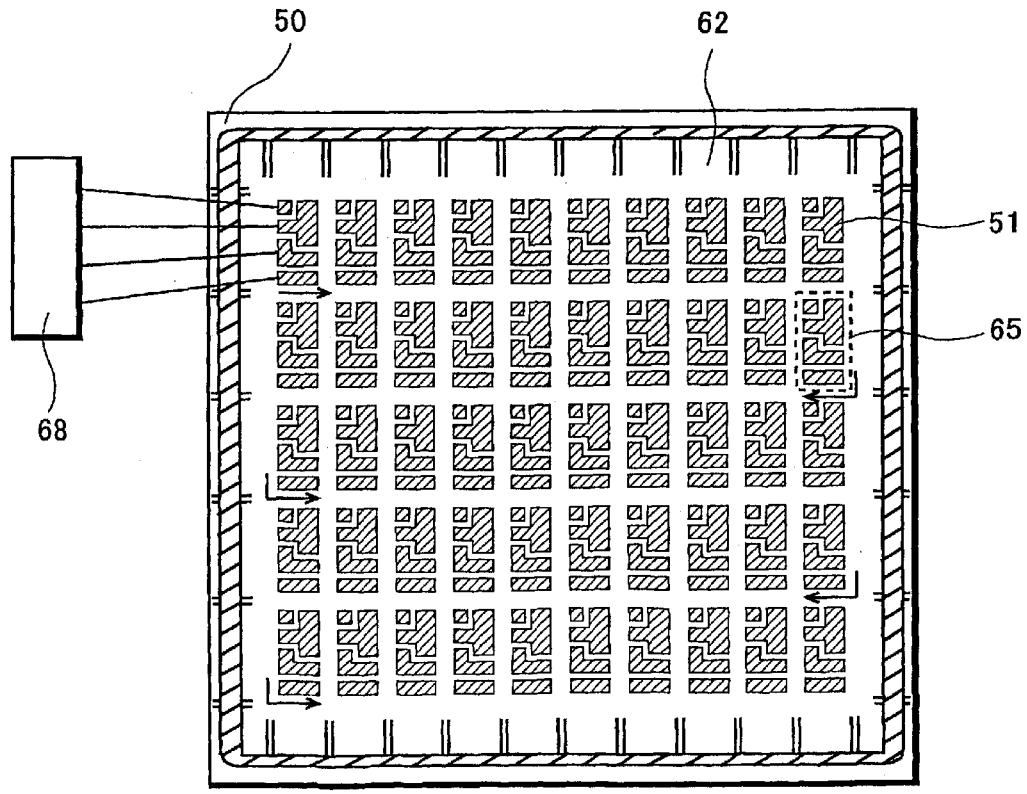
FIG. 9 is a view showing a circuit device manufacturing method of the present invention.

As shown in FIG. 9, in the sixth step of the present invention, the quality of the circuit elements 52 on respective mounting portions 65, that are molded collectively by the insulating resin 50, is.

After the back surface of the conductive foil 60 is etched in the preceding step, respective blocks 62 are separated from the conductive foil 60. Since the blocks 62 are coupled with the remaining portion of the conductive foil 60 via the insulating resin 50, this separation can be attained without the cutting die by mechanically peeling off the insulating resin 50 from the remaining portion of the conductive foil 60.

As shown in FIG. 9, the back surfaces of the conductive patterns 51 are exposed from the back surfaces of respective blocks 62 and respective mounting portions 65 are aligned in perfectly same matrix fashion as that in forming the conductive patterns 51. Then, the characteristic parameters of the circuit elements, such as circuit elements 52A and 52B in FIG. 8, on respective mounting portions 65, are tested individually by bringing a probe 68 into contact with the back-surface electrodes, such as electrodes 56A, 56B, and 56C shown in FIG. 8, exposed from the insulating resin 50 of the conductive patterns 51, to determine the quality of the circuit elements. Then, defective products are marked, for example, by magnetic ink.

In the present step, since the circuit devices 53 on respective mounting portions 65 are supported integrally by the insulating resin 50 every block 62, they are not separated individually. As a result, if the block 62 placed on the loading table of the tester is pitch-fed in the vertical direction and the lateral direction as indicated by an arrow by the size of the mounting portion 65, the circuit devices 53 on respective mounting portions 65 in the block 62 can be measured extremely quickly in large quantities. That is, since the decision of back/front surfaces of the circuit device, the recognition of the electrode positions, etc., all are required in the background art, can be eliminated, the sharp reduction in a measuring time can be achieved.

Figure 10:
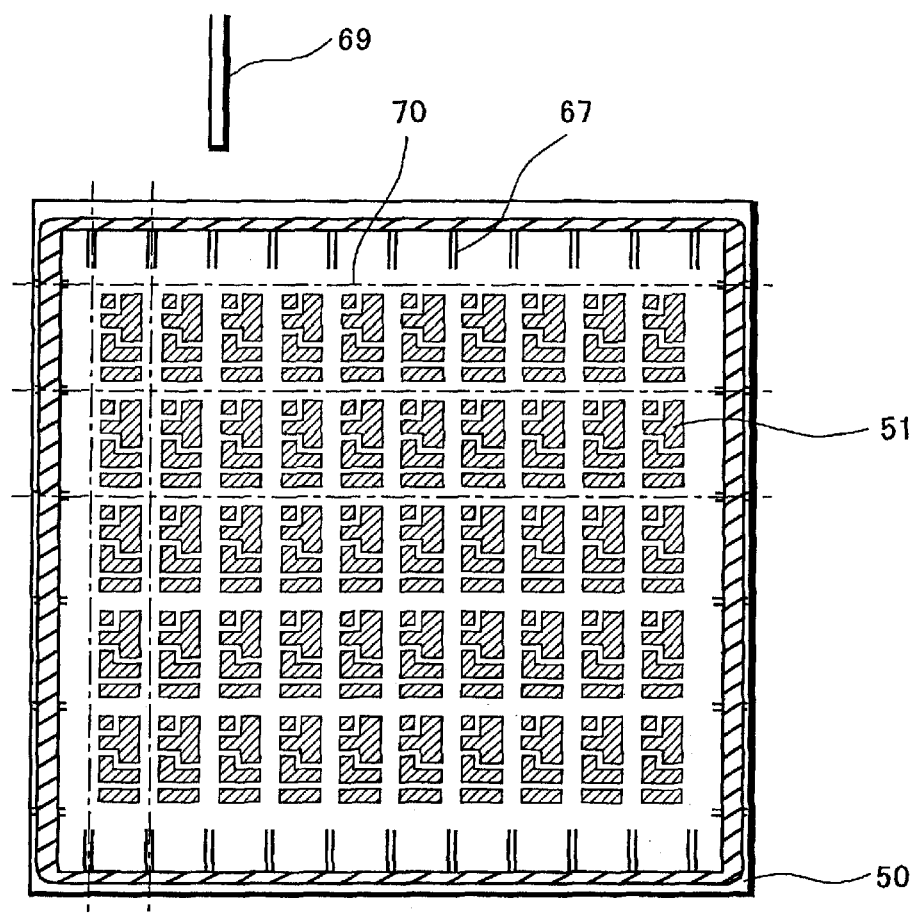
FIG. 10 is a view showing a circuit device manufacturing method of the present invention.
Figure 11:
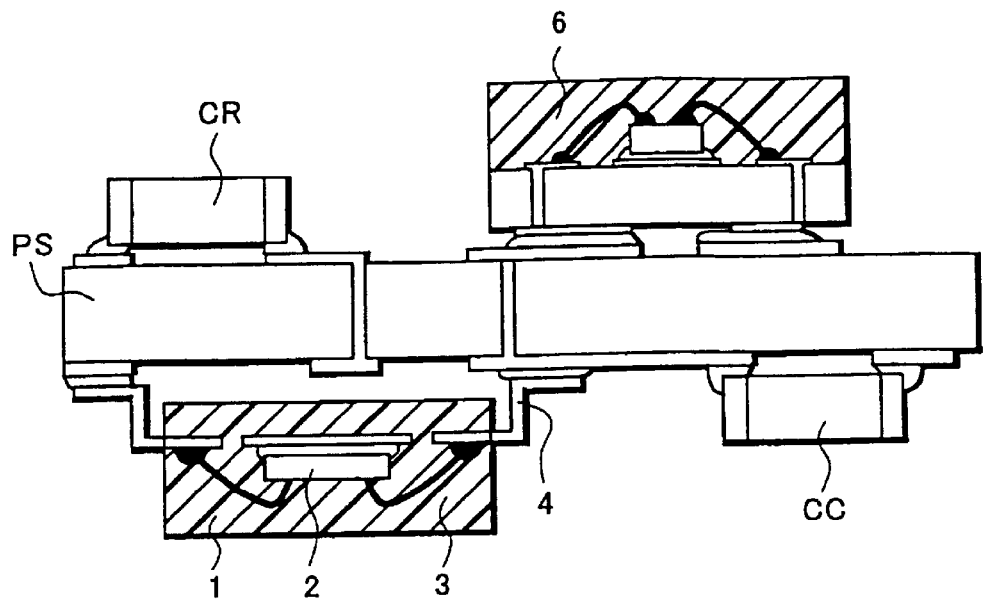
FIG. 11 is a view showing a circuit device manufacturing method in the background art.

As shown in FIG. 10, the seventh step of the present invention resides in that the insulating resin 50 is separated every mounting portion 65 by the dicing.

In the present step, the block 62 is sucked onto the loading table of the dicing apparatus by vacuum, and then the dicing is applied to the insulating resin 50 in the isolation trenches 61 along the dicing lines 70 between respective mounting portions 65 by the dicing blade 69, whereby the block 62 is separated into the individual circuit devices 53.

In the present step, the dicing blade 69 is applied at the depth required to cut the insulating resin 50, and the separated circuit devices 53 may be fitted into the taping housing holes directly from the loading table of the dicing apparatus by the suction collet. In this case, the opposing alignment marks 67 that are formed together with the frame-like pattern 66 provided previously in the above first step around each block are recognized in dicing, and then the dicing is carried out based on the alignment marks 67. Although being well known, the dicing is applied to all the dicing lines 70 in the vertical direction, and then the dicing is applied to the dicing lines 70 in the lateral direction after the loading table is rotated by 90 degree.

In the present invention, the conductive foil per se serving as the material of the conductive patterns is caused to function as the supporting substrate, the overall device is supported by the conductive foil in forming the isolation trenches, in mounting the circuit elements, or in depositing the insulating resin, and the insulating resin is caused to function as the supporting substrate in separating the conductive foil into respective conductive patterns. Therefore, the circuit device can be manufactured by the required minimum of the circuit elements, the conductive foil, and the insulating resin. As explained in the background art, the supporting substrate can be eliminated essentially in constructing the circuit device and the cost becomes inexpensive. Also, there is the merit that, because the supporting substrate is not needed, the conductive patterns are buried in the insulating resin, and thicknesses of the insulating resin and the conductive foil can be adjusted, the low-profile circuit device can be manufactured Also, in the present invention, since the conductive plating layer is arranged on the conductive patterns, first there can be achieved the merit that the contact resistances between the circuit elements and the conductive patterns can be suppressed low and also the good die bonding can be carried out in large quantities, second there can be achieved the merit that the wire bonding can be carried out without fail, and third there can be achieved the merit that the erroneous recognition due to the diffused reflection of the light by the isolation trenches can be eliminated in the pattern recognition required in the steps of the die bonding and the wire bonding.

Then, in the present invention, since the common molding for the block is carried out in the molding step of the insulating resin, the reduction of an amount of resin can be attained.

In addition, in the dicing step, there can be achieved the merit that recognition of the dicing lines can be performed quickly without fail by using the alignment marks. Further, the dicing may be implemented by cutting only the insulating resin layer, the lifetime of the dicing blade can be prolonged since the conductive foil is not cut off, and the metal flash generated when the conductive foil is cut is never generated.

Further, as apparent from FIG. 13, there can be achieved the merits that, since the through-hole forming step, the conductor printing step (in the case of the ceramic substrate), etc. can be omitted, the manufacturing steps can be reduced considerably rather than the background art and also all steps can be handled by ourselves. Besides, since the frame molds are not needed at all, this manufacturing method can give the extremely short delivery time.

What is claimed is:

1. A circuit device manufacturing method comprising:
   preparing a conductive foil;
   providing in the conductive foil, isolation trenches having a depth less than a thickness of the conductive foil;
   providing a conductive plating layer on the conduction foil between the isolation trenches, said conductive plating layer being recessed from edges of the conduction foil;
   providing circuit elements on the conductive plating layer;
   providing an insulating resin to cover collectively the circuit elements and to fill the isolation trenches;
   exposing conductive patterns by removing the conductive foil from opposite to the side where the circuit elements are provided until the insulating resin in the trenches is exposed; and
   dicing the insulating resin appropriately to separate the circuit elements.

2. The circuit device manufacturing method according to claim 1, further comprising:
   electrically connecting electrodes of the circuit elements to the conductive foil before providing the insulating resin.

3. The circuit device manufacturing method according to claim 2, wherein the connecting member is formed by wire bonding.

4. The circuit device manufacturing method according to claim 3, wherein the wire bonding is applied onto the conductive plating layer.

5. The circuit device manufacturing method according to claim 3, wherein a position of the wire bonding is determined by contrasting between a region of the conductive foil without the conductive plating and a region of the conductive plating layer on the conductive foil.

6. The circuit device manufacturing method according to claim 1, wherein the conductive foil is formed of any one of copper, aluminum, and iron-nickel.

7. The circuit device manufacturing method according to claim 1, wherein the conductive plating layer partially covers the conductive foil.

8. The circuit device manufacturing method according to claim 7, wherein the conductive plating layer is formed by gold or silver plating.

9. The circuit device manufacturing method according to claim 1, wherein the isolation trenches formed selectively on the conductive foil are formed by chemical or physical etching.

10. The circuit device manufacturing method according to claim 1, wherein at least one of bare semiconductor chips and chip circuit components are fixed as the circuit elements.

11. The circuit device manufacturing method according to claim 1, wherein the insulating resin is provided by transfer molding.

12. The circuit device manufacturing method according to claim 1, wherein
the circuit elements are provided in blocks which are aligned in matrix fashion on the conductive foil.

13. The circuit device manufacturing method according to claim 12, wherein the insulating resin is provided by transfer molding for every block.

14. The circuit device manufacturing method according to claim 12, wherein the insulating resin is diced to separate the blocks.

15. The circuit device manufacturing method according to claim 14, wherein the dicing is carried out by using alignment marks provided at a periphery of each block.

16. The circuit device manufacturing method according to claim 14, wherein the dicing is carried out by using opposing alignment marks provided at a periphery of each block.

17. The circuit device manufacturing method according to claim 1, further comprising:
after providing trenches in the conductive foil, covering the conductive foil including surfaces of the isolation trenches with a resist layer.

18. The circuit device manufacturing method according to claim 17, further comprising:
after covering the conductive foil with the resist layer, selectively removing the resist layer on the conductive foil.

19. The circuit device manufacturing method according to claim 18, further comprising:
providing the conductive plating layer where the resist layer has been selectively removed.

20. The circuit device manufacturing method according to claim 1 wherein the dicing is carried out by using alignment marks provided at a periphery of each block.

21. The circuit device manufacturing method according to claim 1 wherein the dicing is carried out by using opposing alignment marks provided at a periphery of each block.

* * * * *